(12) United States Patent
Watanuki et al.

(10) Patent No.: US 11,079,540 B2
(45) Date of Patent: Aug. 3, 2021

(54) SEMICONDUCTOR DEVICE

(71) Applicant: RENESAS ELECTRONICS CORPORATION, Tokyo (JP)

(72) Inventors: Shinichi Watanuki, Ibaraki (JP); Yasutaka Nakashiba, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/183,319

(22) Filed: Nov. 7, 2018

(65) Prior Publication Data
US 2019/0196099 A1 Jun. 27, 2019

(30) Foreign Application Priority Data

Dec. 22, 2017 (JP) .............................. JP2017-246106

(51) Int. Cl.

| G02F 1/035 | (2006.01) |
|---|---|
| G02F 1/295 | (2006.01) |
| G02B 6/10 | (2006.01) |
| G02B 6/122 | (2006.01) |
| H01L 23/532 | (2006.01) |
| H01L 25/16 | (2006.01) |
| H01L 21/02 | (2006.01) |
| G02F 1/025 | (2006.01) |
| G02B 6/12 | (2006.01) |
| H01L 23/34 | (2006.01) |
| G02B 6/43 | (2006.01) |

(52) U.S. Cl.
CPC ....... *G02B 6/1223* (2013.01); *G02B 6/12004* (2013.01); *G02F 1/025* (2013.01); *H01L 21/0214* (2013.01); *H01L 21/02219* (2013.01); *H01L 23/5329* (2013.01); *H01L 25/167* (2013.01); *G02B 6/43* (2013.01); *G02B 2006/12061* (2013.01); *G02B 2006/12123* (2013.01); *G02B 2006/12142* (2013.01); *G02B 2006/12176* (2013.01); *H01L 23/345* (2013.01)

(58) Field of Classification Search
CPC .............. G02B 6/1223; H01L 21/0214; H01L 21/02219; H01L 23/5329; H01L 25/167
USPC ........................................................ 385/1-3
See application file for complete search history.

(56) References Cited

U.S. PATENT DOCUMENTS

| 8,213,751 | B1* | 7/2012 | Ho ......................... G02B 6/43 385/1 |
|---|---|---|---|
| 2016/0334573 | A1* | 11/2016 | Kunishima ....... H01L 23/53214 |
| 2016/0370542 | A1* | 12/2016 | Usami ..................... G02B 6/13 |

FOREIGN PATENT DOCUMENTS

| JP | 03-158802 A | 7/1991 |
|---|---|---|
| JP | 11-133254 A | 5/1999 |

* cited by examiner

*Primary Examiner* — Kaveh C Kianni
*Assistant Examiner* — Hung Q Lam
(74) *Attorney, Agent, or Firm* — McDermott Will & Emery LLP

(57) ABSTRACT

Two optical waveguides and an insulating film provided to cover the optical waveguides are formed over an insulating layer. Two wirings and a heater metal wire are formed over the insulating film via an insulating film different from the above insulating film. The latter insulating film is thinner than the former insulating film, and has a higher refractive index than the former insulating film. The leaked light from either of the two optical waveguides can be suppressed or prevented from being reflected by any one of the two wirings, the heater metal wire, and the like to travel again toward the two optical waveguides by utilizing the difference between the refractive indices of the two insulating films.

14 Claims, 8 Drawing Sheets

SEMICONDUCTOR DEVICE

CROSS-REFERENCE TO RELATED APPLICATIONS

The disclosure of Japanese Patent Application No. 2017-246106 filed on Dec. 22, 2017 including the specification, drawings and abstract is incorporated herein by reference in its entirety.

BACKGROUND

The present invention relates to a semiconductor device and, for example, to a technology of a semiconductor device including an optical device.

An optical device is described in, for example, Patent Documents 1 and 2. Patent Document 1 discloses a technology for manufacturing a polymer waveguide by sequentially coating a lower cladding layer (refractive index n1), a core layer (refractive index n2), a first upper cladding layer (refractive index n3), and a second upper cladding layer (refractive index n4) over a substrate in which the relationship of the refractive indices is n2>n3>n1, n4.

Patent Document 2 discloses an optical waveguide including a first cladding layer formed over a substrate, a core layer formed thereover, an intermediate thin layer covering the surfaces of the first cladding layer and the core layer with good adhesion and having a compatibility, and a second cladding layer formed thereover. Also, Patent Document 2 discloses the fact that if the refractive index of the first cladding layer is nc1, that of the second cladding layer is nc2, that of the core layer is n, and that of the intermediate thin layer is n1, the relationship of n1≤n, nc1, nc2 or n≥n1≥nc1, nc2 should be satisfied.

RELATED ART DOCUMENT

Patent Document

[Patent Document 1] Japanese Unexamined Patent Application Publication No. Hei 11(1999)-133254
[Patent Document 2] Japanese Unexamined Patent Application Publication No. Hei 3(1991)-158802

SUMMARY

A semiconductor device including an optical device is required to be further improved in reliability for practical use.

Other problems and new characteristics will become clear from the description and accompanying drawings of the present specification.

In a semiconductor device according to one embodiment, an optical waveguide having a refractive index n1 and a second insulating film covering the optical waveguide and having a refractive index n2 are formed over a first insulating film composing a substrate. A conductive film is formed over the second insulating film via a third insulating film having a refractive index n3. The shortest distance between the optical waveguide and the third insulating film is smaller than the thickness of the first insulating film, and the refractive indices n1, n2, and n3 satisfy the relationship of n1>n2 and n3>n2.

According to the one embodiment, the reliability of a semiconductor device including an optical device can be improved.

DETAILED DESCRIPTION

Figure 1:
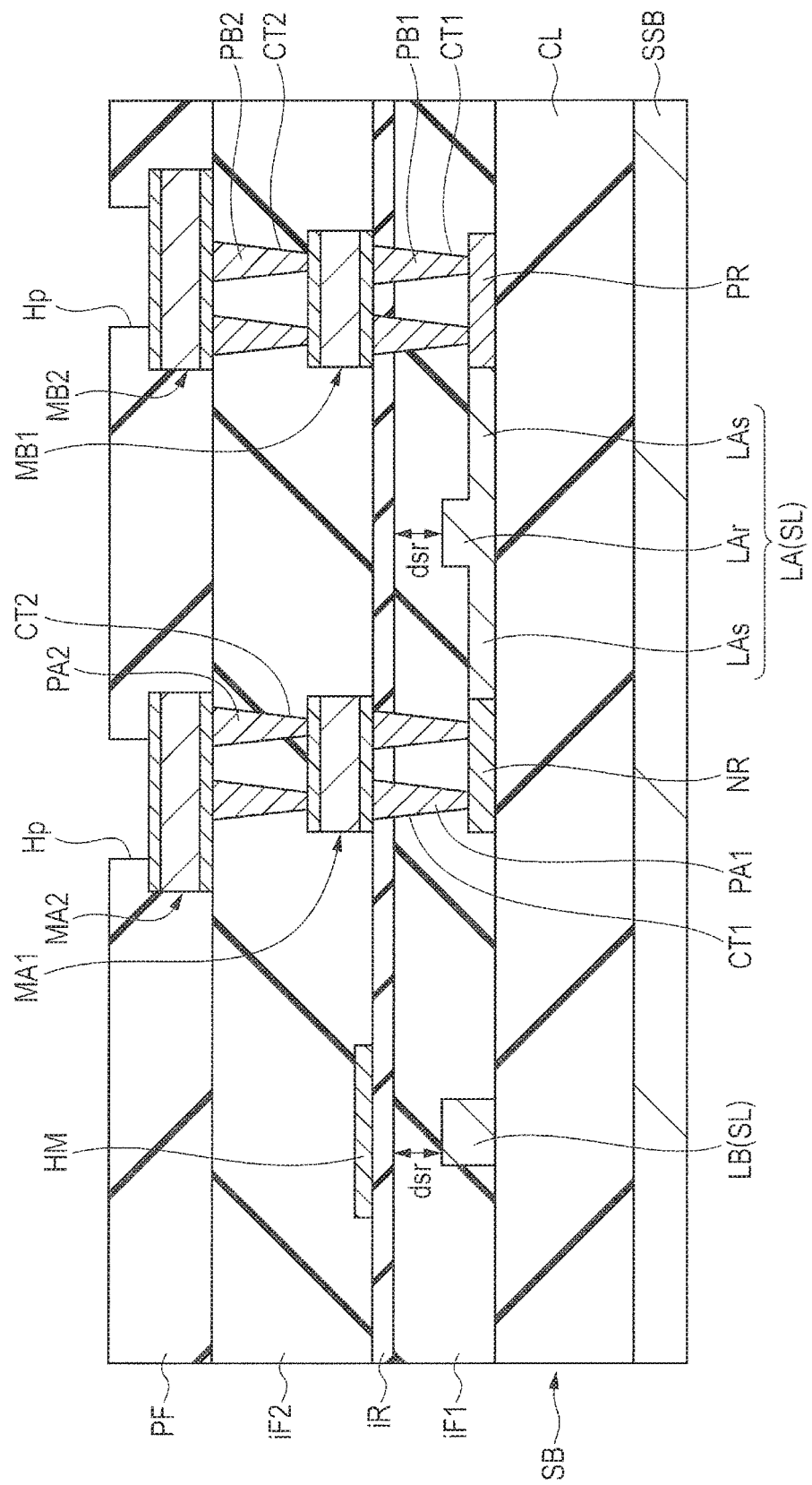
FIG. 1 is a sectional view of a main part of a semiconductor device according to First Embodiment.

Explanation of Description Form, Basic Term, Usage in the Present Specification In the present specification, the description of each embodiment is divided into a plurality of sections and the like for convenience if necessary, but these are not independent from each other unless expressly stated otherwise, and regardless of before or after the description, one of the respective parts of a single example is a partial detail, a partial or entire modification, or the like of the others. Also, repetitive description of similar parts will be omitted in principle. Also, each constituent element in each embodiment is not essential unless it is expressly stated otherwise, unless it is theoretically limited to that number, or unless it is obviously otherwise from the context.

Likewise, in the description of each embodiment, etc., even when it is described as "K including B" and the like regarding materials, compositions, or the like, it should not be excluded that K can include elements other than B unless it is expressly stated otherwise, or unless it is obviously otherwise from the context. For example, in terms of components, it means that "K including B as a main component" and the like. For example, even when it is described as "silicon members" and the like, they should not be limited to pure silicon, and it is needless to say that they include members containing a silicon-germanium (SiGe) alloy or a multicomponent alloy containing other silicon as a main component, and other additives, etc.

Also, in the present specification, the terms of "electrode" and "wiring" do not limit them functionally. For example, "electrode" may be used as part of "wiring" and vice versa. Furthermore, the terms of "electrode" and "wiring" include the case where a plurality (or a plurality of layers) of "electrodes" and "wirings" are integrally formed, and the like.

When a specific value or amount is referred to, a value that is larger or smaller than the specific value may be acceptable unless it is expressly stated otherwise, unless it is theoretically limited to the value, or unless it is obviously otherwise from the context.

In each view in each embodiment, the same or similar parts will be denoted with the same or similar symbols or reference numerals, and description thereof will not be repeated in principle.

In the accompanying views, hatching, etc., may be omitted even in a sectional view when the view becomes complicated, or when the distinction with a gap is clear. In relation to this, the contour line of a background may be omitted even with a planarly-closed hole when it is clear from the description, etc. Furthermore, hatching or dot patterns may be added even if it is not a section to clearly indicate that it is not a gap or to clearly indicate the boundary of a region.

Also, in the present specification, a plan view means the case viewed from a direction perpendicular to the main surface of a substrate.

<Study by Inventors>

In an optical device in which an optical waveguide is formed by using a semiconductor layer, a silicon oxide film (cladding layer) having a lower refractive index than the semiconductor layer is formed around the optical waveguide (core layer), so that light is confined in the optical waveguide by utilizing the difference between the refractive indices of the core layer and the cladding layer. However, the optical signals propagating through the optical waveguide are not completely confined, and in fact leaked light called evanescent wave exudes around the wavelength.

Therefore, when functional devices using semiconductors are integrated by a semiconductor manufacturing technique, scattering or reflection of light is caused when the leaked light from the optical waveguide hits a metal wiring for device control that is provided near the optical waveguide, and the scattered light or reflected light may enter the optical waveguide again to cause noise. Therefore, there is the problem that the optical signals propagating through the optical waveguide become false signals to reduce the reliability of the optical signals, which leads to a reduction in the reliability of the optical device.

For the above reason, it is preferable to arrange the a metal wiring away from the optical waveguide by a distance larger than or equal to a distance at which the evanescent wave from the optical waveguide sufficiently attenuates (e.g., approximately 1 to 2 μm that is sufficiently larger than the wavelength of light in an insulating film medium), even when the difference between the refractive indices of the core layer and the cladding layer is large and the confinement of light is strong. For this reason, however, the metal wiring should be arranged at a position other than the periphery of the optical waveguide and electrode lead-out is also greatly limited, which causes the problem that even if the devices are integrated, reducing the chip area is hindered.

Also, a semiconductor serving as an optical waveguide has a large thermo-optic effect and may be used as a thermo-optical device. In this case, a heater metal wire serving as a heat source should be arranged as close as possible to the optical waveguide in order to control (manipulate) the refractive index of the optical waveguide with the heating temperature from the heater metal wire. Therefore, there is the problem that it is difficult to avoid the influence of scattered light or reflected light (return light) caused when the leaked light from the optical waveguide hits the heater metal wire.

First Embodiment

<Example of Configuration of Semiconductor Device>

Figure 2:
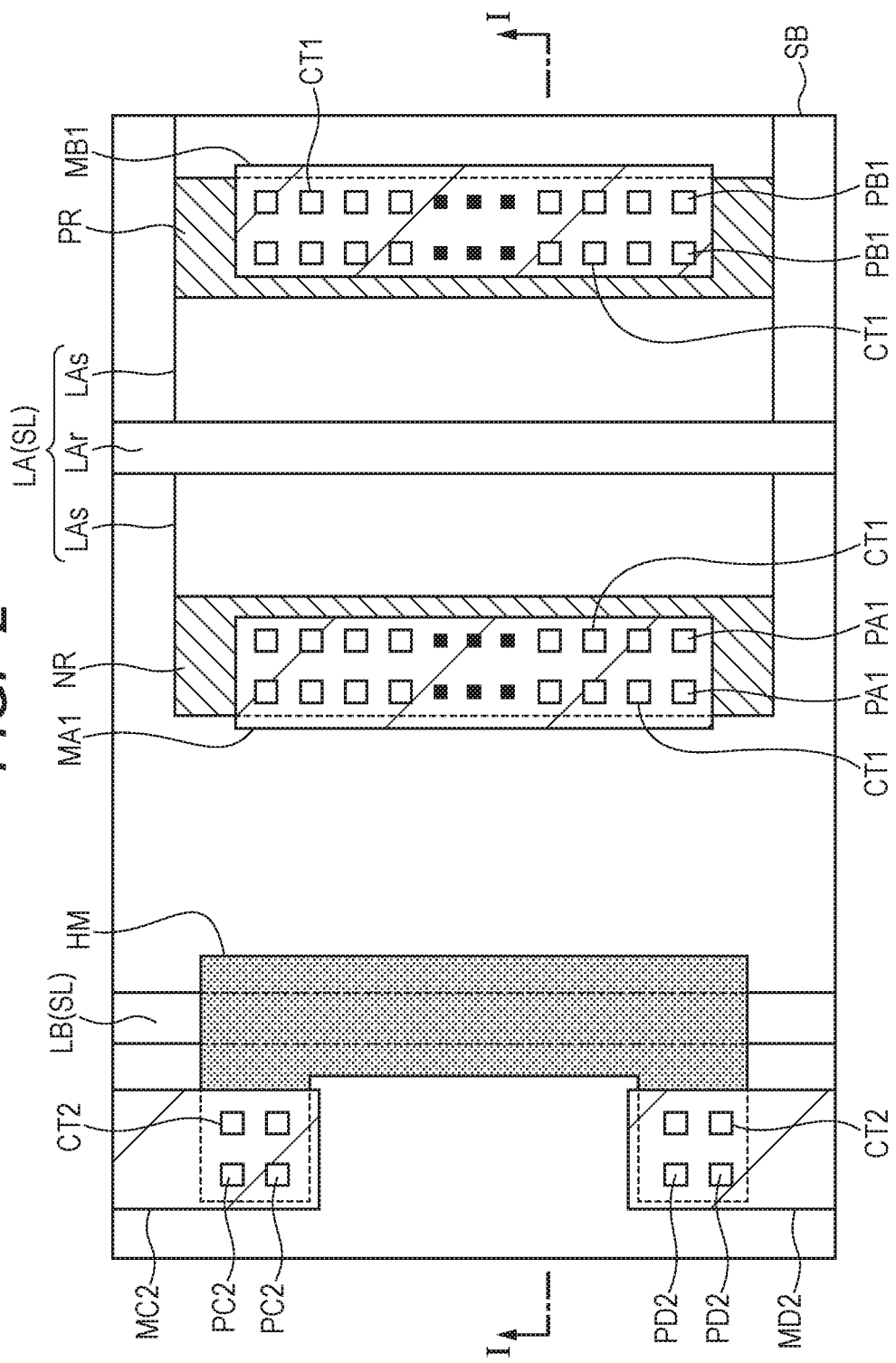
FIG. 2 is a plan view of the main part of the semiconductor device of FIG. 1.
Figure 3:
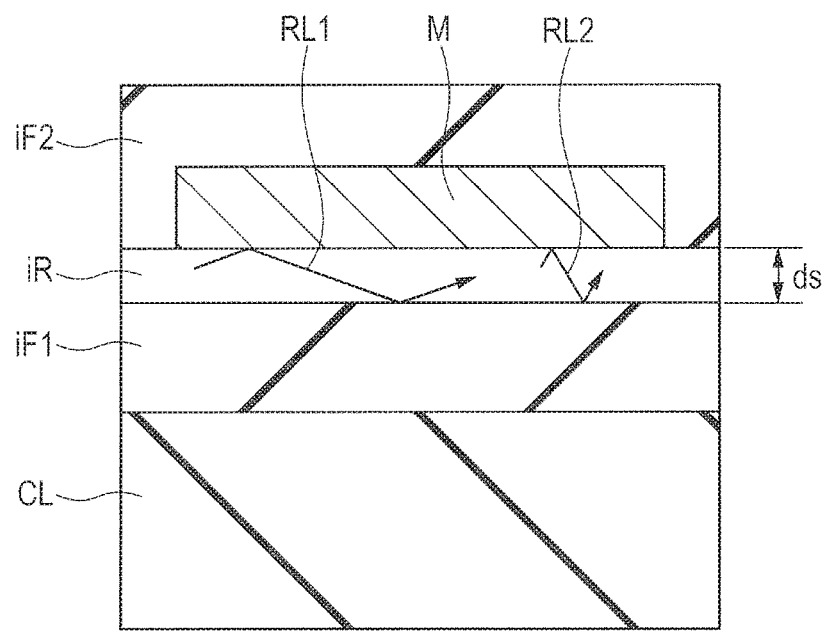
FIG. 3 is an enlarged sectional view of the main part of the semiconductor device of FIG. 1.

FIG. 1 is a sectional view of a main part of a semiconductor device according to First Embodiment, FIG. 2 is a plan view of the main part of the semiconductor device of FIG. 1, and FIG. 3 is an enlarged sectional view of the main part of the semiconductor device of FIG. 1. FIG. 1 is a sectional view taken along Line I-I of FIG. 2. In FIG. 2, hatching is given to wiring, a heater metal wire, and a semiconductor region in order to make the view easy to be seen.

A substrate SB composing the semiconductor device according to First Embodiment is composed of an SOI (Silicon on Insulator) substrate having a support substrate SSB, an insulating layer CL formed over the support substrate SSB, and a semiconductor layer SL formed over the insulating layer CL, as illustrated in FIG. 1. However, the substrate SB should not be limited to ones having the support substrate SSB, and for example, an SOS (Silicon on Sapphire) substrate, a substrate having a two-layer structure, in which a support substrate itself is not included and a semiconductor layer is provided over an insulating layer (sapphire, quartz, or the like) functioning as a support substrate, may be used.

The lowermost support substrate SSB includes, for example, a p-type silicon (Si) single crystal having a plane orientation of (100) and a resistivity of approximately 5 to 50 Ωcm. The intermediate insulating layer (first insulating film) CL is also called a BOX (Buried Oxide) layer and includes, for example, a silicon oxide ($SiO_2$) film. The thickness of the insulating layer CL is, for example, 1 μm or larger, and specifically, for example, approximately 2 to 3 μm in order to reduce light loss. The electrostatic capacitance between the support substrate SSB and the semiconductor layer SL can also be reduced by increasing the thickness of the insulating layer CL. The uppermost semiconductor layer SL is also called an SOI layer or an element formation layer, and is made by thinning a p-type Si single crystal substrate having, for example, a plane orientation of (100) and a resistivity of approximately 5 to 50 Ωcm. The thickness of the semiconductor layer SL is, for example, approximately 180 to 250 nm.

Si composing the semiconductor layer SL is a material transparent to the light having, for example, a wavelength band of 1.3 to 1.6 μm (communication wavelength band) for optical communication, and the refractive index of Si is, for example, 3.5 for the light having the above wavelength band. The semiconductor layer SL including such Si composes a core portion that propagates light, as described later. On the other hand, the refractive index of $SiO_2$ composing the insulating layer CL is lower than that of the semiconductor layer SL, and is, for example, 1.45 for the light having the wavelength, and the insulating layer CL composes a cladding portion.

Optical waveguides LA and LB and an insulating film (second insulating film) iF1, for covering the optical waveguides LA and LB, are formed over the main surface of the substrate SB (over the insulating layer CL). Each of the optical waveguides LA and LB functions as a core portion that propagates light along the main surface of the substrate SB, and it is formed of the above semiconductor layer SL. An insulating film (third insulating film) iR is formed over the insulating film iF1 covering the optical waveguides LA and LB. Wirings (conductive film) MA1 and MB1, wirings (conductive film) MC1 and MD1 (see FIG. 2), a heater metal wire (conductive film) HM, and an insulating film iF2, for covering the wirings MA1 and MB1, the wirings MC1 and MD1, and the heater metal wire HM, are formed over the insulating film iR. Further, wirings MA2 and MB2, and a protective film PF, for covering the wirings MA2, MB2, MC2, and MD2, are formed over the insulating film iF2. The configurations of them will be described below.

<Regarding Optical Waveguide LA>

The optical waveguide LA exemplifies an optical waveguide composing an electrically controlled optical modulator that electrically controls (modulates) the phase of light propagating through the optical waveguide LA. The shape of the section of the optical waveguide LA, the section crossing the propagation direction of optical signals, is formed, for example, in a convex shape. That is, the optical waveguide LA integrally has a relatively thick rib portion LAr and a relatively thin slab portion LAs formed on both sides in the width direction (the short direction, a direction crossing the propagation direction of light and running along the main surface) of the rib portion LAr.

The rib portion LAr is a portion that mainly propagates light. The rib portion LAr is arranged at the center in the width direction (the short direction, a direction crossing the propagation direction of light and running along the main surface) of the optical waveguide LA, and is formed to be thicker than the slab portion LAs so as to protrude upward from the upper surface of the slab portion LAs in sectional view. That is, the height of the upper surface of the rib portion LAr from the upper surface of the insulating layer CL is higher than the height of the upper surface of the slab portion LAs therefrom. The rib portion LAr is formed such that its height (thickness) is equal along the propagation direction of light, and its height is, for example, approximately 180 to 250 nm. Also, the rib portion LAr is formed, for example, in a band shape in plan view, as illustrated in FIG. 2. The rib portion LAr is formed such that its width (dimension in the short direction) is equal along the propagation direction of light, and its width is, for example, approximately 300 nm to 400 nm.

The slab portion LAs is a portion that mainly supplies potential to the optical waveguide LA. The slab portion LAs is formed such that its height (thickness) is equal along the propagation direction of light, and its height is, for example, approximately 100 nm. An $n^+$-type semiconductor region NR is formed at the outer end portion of the slab portion LAs on one side in the width direction of the rib portion LAr, and a $p^+$-type semiconductor region PR is formed at the outer end portion of the slab portion LAs on the other side of the rib portion LAr. The length of each of the semiconductor regions NR and PR in the width direction of the rib portion LAr may be nearly one at which carriers can be supplied, and is, for example, approximately 0.5 µm. Also, it is preferable that the interval between the end in the width direction of the rib portion LAr and the end of each of the semiconductor regions NR and PR (width of the slab portion LAs) is large to some extent from the viewpoint of suppressing occurrence of propagation loss of light that is caused by the light, exuding outside the rib portion LAr when light propagates through the rib portion LAr serving as an optical waveguide, being scattered by impurities inside the semiconductor regions NR and PR. The interval is, for example, larger than 1 µm (=1.5/1.45). Herein, the $n^+$-type semiconductor region NR contains, for example, phosphorus (P) or arsenic (As), and the $p^+$-type semiconductor region PR contains, for example, boron (B).

The slab portion LAs and the rib portion LAr between the $n^+$-type semiconductor region NR and the $p^+$-type semiconductor region PR are formed of, for example, an intrinsic semiconductor (i.e., an i (intrinsic)-type semiconductor). That is, the optical waveguide LA has, for example, a p-i-n junction diode structure. However, the structure of the optical waveguide LA should not be limited to a p-i-n junction diode structure, and can be variously changed, and may be a p-n junction diode structure or a SIS (Semiconductor Insulator Semiconductor) structure. In the case of a p-n junction diode structure, an n-type semiconductor region in contact with the $n^+$-type semiconductor region NR and a p-type semiconductor region in contact with the $p^+$-type semiconductor region PR are formed in the semiconductor layer SL composing the optical waveguide LA, and a p-n junction is formed with the p-type semiconductor region and the n-type semiconductor region brought into contact with each other in the rib portion LAr. In the case of a SIS structure, a semiconductor layer for control is provided over the semiconductor layer SL composing the optical waveguide LA via a dielectric layer.

The $n^+$-type semiconductor region NR of the slab portion LAs is electrically coupled to the wirings MA1 through a plurality of plugs PA1, and the $p^+$-type semiconductor region PR thereof is electrically coupled to the wirings MB1 through a plurality of plugs PB1. Each of the plugs PA1 and PB1 is formed by embedding a conductor film containing such as, for example, W in a contact hole CT1 drilled in the insulating films iF1 and iR. Herein, the impurity concentration of each of the $n^+$-type semiconductor region NR and the $p^+$-type semiconductor region PR is set such that the contact state with each of the plugs PA1 and PB1 becomes an ohmic contact.

Each of the wirings MA1 and MB1 is formed of a laminated film in which, for example, titanium (Ti), titanium nitride (TiN), aluminum (Al), TiN, and Ti are laminated in this order. However, for example, copper (Cu) or tungsten (W) may be used instead of Al. A laminated film of Ti and TiN is a barrier metal layer. The wiring MA1 is formed to overlap the $n^+$-type semiconductor region NR of the optical waveguide LA in plan view, as illustrated in FIG. 2. On the other hand, the wiring MB1 is formed to overlap the $p^+$-type semiconductor region PR of the optical waveguide LA in plan view.

The wirings MA1 are electrically coupled to the wirings MA2 through a plurality of plugs PA2, and the wirings MB1 are electrically coupled to the wirings MB2 through a plurality of plugs PB2, as illustrated in FIG. 1. Each of the plugs PA2 and PB2 is formed by embedding a conductive film containing such as, for example, W in a contact hole CT2 drilled in the insulating film iF2. The configuration of each of the wirings MA2 and MB2 is, for example, the same as that of each of the wirings MA1 and MB1.

The protective film PF covering the wirings MA2 and MB2 is formed of, for example, silicon oxide, silicon oxynitride, PSG (PhosphoSilicate Glass), or silicon nitride (SiN). Openings Hp are formed in parts of the protective film PF, and parts of the wirings MA2 and MB 2 are exposed. The exposed portions of the wirings MA2 and MB2 serve as coupling pad portions to be coupled to the external wirings.

In the optical waveguide LA composing such an electrically controlled optical modulator, the phase of light is modulated by utilizing a carrier plasma effect (a phenomenon in which the refractive index of the optical waveguide LA is dependent on the concentration of carriers (electron-hole pairs) in the semiconductor composing the optical waveguide LA). That is, in the optical waveguide LA having a p-i-n junction or p-n junction diode structure, the phase of light is modulated by injecting (extracting) carriers into (from) the optical waveguide LA (mainly the rib portion LAr) with a forward bias (a reverse bias) applied to the diode to reduce(increase) the refractive index of the optical waveguide LA (mainly the rib portion LAr). In the optical waveguide LA having a SIS structure, the phase of light is modulated by injecting (extracting) carriers into (from) the optical waveguide LA (mainly the rib portion LAr) with a voltage applied to the semiconductor layer for control to reduce (increase) the refractive index of the optical waveguide LA (mainly the rib portion LAr).

<Regarding Optical Waveguide LB>

The optical waveguide LB exemplifies an optical waveguide composing a temperature-controlled optical modulator that controls (modulates) the phase of light propagating through the optical waveguide LB with temperature. The optical waveguide LB is formed of, for example, an intrinsic semiconductor, and the shape of a section crossing the propagation direction of optical signals is formed in a rectangular (quadrangular) shape. Also, the optical waveguide LB is formed, for example, in a band shape in plan view, as illustrated in FIG. 2.

The heater metal wire HM is formed over the insulating film iR immediately above the optical waveguide LB. The heater metal wire HM includes a high melting point metal such as, for example, Ti or W, and is formed to cover, in plan view, part of the optical waveguide LB, i.e., to overlap part of the optical waveguide LB, as illustrated in FIG. 2. One end side of the heater metal wire HM is electrically coupled to the wirings MC2 through a plurality of plugs PC2, and the other end side thereof is electrically coupled to the wirings MD2 through a plurality of plugs PD2. The configuration examples of the plugs PC2 and PD2 are the same as those of the plugs PA1 and PB1. The wirings MC2 and MD2 are formed, for example, in a wiring layer above the wirings MA1 and MB1. The configuration examples of the wirings MC2 and MD2 are the same as those of the wirings MA1 and MB1.

In the optical waveguide LB composing such a temperature-controlled optical modulator, the phase of light is modulated by utilizing a thermo-optic effect (a phenomenon in which the refractive index of the optical waveguide LB is dependent on heating temperature). That is, the phase of light is modulated by heating the optical waveguide LB with the heater metal wire HM heated by applying a predetermined electric power to change the refractive index of the optical waveguide LB.

<Regarding Insulating Films iF1 and iF2>

The insulating films iF1 and iF2 are insulating films that function as cladding portions that confine light in the optical waveguides LA and LB, and it is preferable that they are formed of the same material as that of the above insulating layer CL. The thickness of the insulating film iF1 is larger than the insulating film iR to reduce light loss, and it is, for example, 1 to 2 µm. The total thickness of the insulating films iF1 and iF2 is, for example, 2 to 5 µm. Herein, when it is assumed that the refractive indices of the optical waveguides LA and LB (semiconductor layer SL) are n1 and those of the insulating layer CL and the insulating films iF1 and iF2 are n2, the relationship of n1>n2 is satisfied. Light can be propagated through the optical waveguides LA and LB while being confined therein by surrounding the optical waveguides LA and LB each having a relatively high refractive index with the lower insulating layer CL and the upper insulating films iF1 and iF2 each having a relatively low refractive index.

<Regarding Insulating Film iR>

The insulating film iR suppresses or prevents occurrence of return light (reflected light) from the conductive films (reflection films) such as the wirings MA1 and MB1 and the heater metal wire HM to the optical waveguides by utilizing the difference between the refractive indices of the insulating film iR and the insulating films iF1 and iF2. The insulating film iR is formed of, for example, silicon nitride (SiN) or silicon oxynitride (SiON). The refractive index of silicon nitride is, for example, 1.9 or higher. The refractive index of silicon oxynitride is between the refractive indices of silicon oxide and silicon nitride, and is, for example, 1.45 to 1.9. Herein, when it is assumed that the refractive indices of the insulating layer CL and the insulating films iF1 and iF2 are n2 and the refractive index of the insulating film iR is n3, the relationship of n3>n2 is satisfied. That is, the refractive index of the insulating film iR is higher than the refractive index (1.45) of silicon oxide composing the insulating films iF1 and iF2. Thereby, scattered light, reflected light or the like, caused by the leaked light from the optical waveguide LA or LB hitting the wiring MA1 or MB1 or the heater metal wire HM, can be suppressed or prevented from returning to the optical waveguide LA or LB again. That is, return light (reflected light RL1, RL2), reflected from the conductive film M such as the wiring, the electrode or the heater metal wire toward the optical waveguide LA or LB (see FIG. 1), is likely to be reflected toward the conductive film M by the difference between the refractive indices of the insulating film iF1 and the insulating film iR at the interface between them, as illustrated in FIG. 3. Therefore, the return light (reflected light RL1, RL2) from the conductive film M to the optical waveguide LA or LB can be suppressed or prevented. Accordingly, noise can be suppressed or prevented from entering the optical waveguides LA and LB, and hence the reliability of the optical signals propagating through the optical waveguides LA and LB can be improved. In particular, in the optical waveguide LB, the influence of the return light (reflected light) from the heater metal wire HM can be suppressed or prevented, even if the heater metal wire HM is arranged close to the optical waveguide LB, as illustrated in FIG. 1. Therefore, the reliability of the optical signals propagating through the optical waveguide LB can also be improved without a decrease in the controllability (operability) of the refractive index of the optical waveguide LB.

Because return light (reflected light) from the wiring MA1 or MB1 or the like to the optical waveguide LA can be suppressed or prevented, the distance between each of the wirings MA1 and MB1 and the rib portion LAr of the optical waveguide LA can be reduced. That is, the dimension in the width direction of the optical waveguide LA can be reduced. Therefore, the wirings MA1 and MB1 can be efficiently arranged, and hence the chip size can be reduced. Also, the parasitic resistance between each of the wirings MA1 and MB1 and the rib portion LAr can be reduced, and hence the performance of the semiconductor device can be improved.

Also, the shortest distance dsr between each of the optical waveguides LA and LB and the insulating film iR (in this example, the distance between the upper surface of the rib portion LAr of the optical waveguide LA or the upper surface of the optical waveguide LB and the lower surface of the insulating film iR immediately thereabove) can be made smaller than the thickness of the insulating layer CL (a distance at which the evanescent wave from the optical waveguide LA or LB sufficiently attenuates).

In the case where the insulating films iF1 and iF2 are formed of silicon oxide and the insulating film iR is formed of silicon nitride, silicon nitride has a higher dielectric constant than silicon oxide, whereby there is the fear that when high-speed electrical signals are handled, the capacitance load of wiring may be increased. Accordingly, it is preferable to form the insulating film iR as thin as possible in order to reduce the capacitance load. Herein, among the reflected light incident on the insulating film iR from the conductive film M, the reflected light RL1 having an angle nearly parallel to the interface between the insulating films iF1 and iR is totally reflected into the insulating film iR by the difference between the refractive indices of the insulating films iF1 and iR, as illustrated in FIG. 3. Therefore, for the reflected light not totally reflected among the light incident on the insulating film iR from the conductive film M, that is, for the reflected light RL2 having an angle close to perpendicular to the interface between the insulating films iF1 and iR, it is sufficient to consider an optimal film thickness. As one example, in a laminated structure of a silicon oxide film/a silicon nitride film/a silicon oxide film, the minimum thickness ds of the insulating film iR, at which the reflectance of the light perpendicularly incident on the interface between the silicon oxide film and the silicon nitride film becomes maximum, is, for example, approximately 0.20 µm, assuming that the wavelength of the light is 1.55 µm. Accordingly, it is preferable to set the thickness of the insulating film to, for example, approximately 0.20 µm in order to minimize the capacitance load while suppressing or preventing both of the reflected light RL1 and RL2 from traveling toward the optical waveguides LA and LB. In FIG. 3, hatching of the insulating film iR is omitted to make the view easy to be seen.

<Configuration Example of Optical Modulator>

Figure 4:
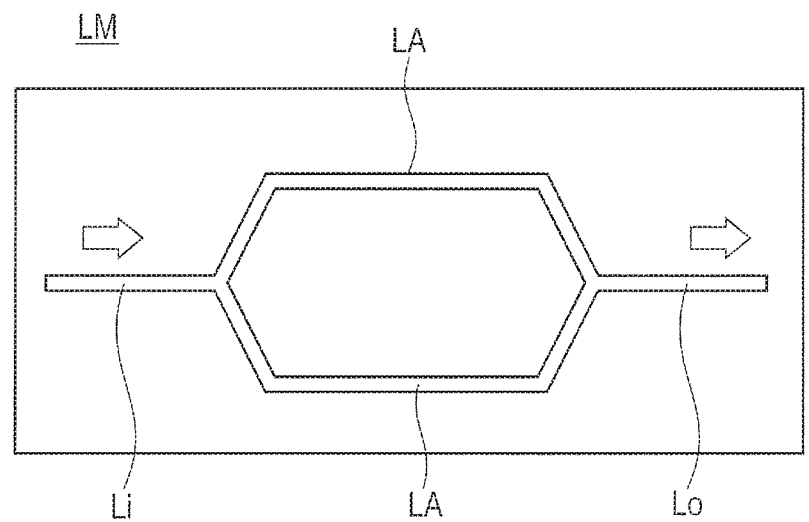
FIG. 4 is a schematic plan view of an optical modulator using the semiconductor device of FIG. 1.

Next, one example of an optical modulator using an optical waveguide composing the semiconductor device of First Embodiment will be described with reference to FIG. 4. FIG. 4 is a schematic plan view of an optical modulator using the semiconductor device of FIG. 1. The arrows in FIG. 4 indicate the propagation direction of light.

An optical modulator LM has an input optical waveguide Li, an output optical waveguide Lo, and two optical waveguides LA and LA optically coupled in parallel to each other therebetween.

The input optical waveguide Li and the output optical waveguide Lo are configured similarly to the optical waveguide LB in FIG. 1. In this case, however, the heater metal wire HM is not formed immediately above each of the optical waveguides Li and Lo. The structure of each of the optical waveguides LA and LA is the same as described above.

In such an optical modulator LM, the light input through the input optical waveguide Li is split into the two optical waveguides LA and LA where a phase difference is given in each of the optical waveguides LA and LA, and then the split light is merged in the output optical waveguide Lo. The phase and amplitude of the light can be modulated by the interference of the light at the merging in the optical waveguide Lo. According to First Embodiment, the reliability of the optical waveguide LA can be improved as described above, and hence the reliability of the optical modulator LM can be improved.

<Example of Manufacturing Method of Semiconductor Device>

Next, one example of a manufacturing method of the semiconductor device of First Embodiment will be described with reference to FIG. 1.

First, the substrate SB is introduced into a manufacturing apparatus of semiconductor devices. The substrate SB at this stage is, for example, an SOI substrate in which the semiconductor layer SL is formed over the support substrate SSB via the insulating layer CL. The insulating layer CL includes, for example, silicon oxide, and its thickness is set, for example, to 1 to 2 µm from the viewpoint of reducing light loss. The semiconductor layer SL includes, for example, a Si single crystal, and has a thickness of, for example, approximately 100 to 500 nm.

Next, the optical waveguides LA and LB are formed by patterning the semiconductor layer SL by a lithography process and a dry etching process. Subsequently, the insulating film iF1 for cladding is deposited over the substrate SB by a CVD (Chemical Vapor Deposition) process or the like so as to cover the optical waveguides LA and LB. The insulating film iF1 includes, for example, silicon oxide, and has a thickness of, for example, 1 to 2 µm. Thereafter, the insulating film iR is deposited over the insulating film iF1 by a CVD process or the like. The insulating film iR includes, for example, silicon nitride or silicon oxynitride, and is formed such that its thickness is smaller than that of the insulating film iF1. The shortest distance between the upper surface of each of the optical waveguides LA and LB and the lower surface of the insulating film iR is smaller than the thickness of the insulating layer CL.

Next, the contact hole CT1 is formed in the insulating films iR and iF1 by a lithography process and a dry etching process. Subsequently, a conductive film is deposited over the insulating film iF1 by a sputtering process, a CVD method, or the like, and the wirings MA1 and MB1 and the heater metal wire HM are formed by further patterning the conductive film by a lithography process and a dry etching process. The heater metal wire HM may be formed separately from the wirings MA1 and MB1 or may be formed by using a barrier metal layer of the wiring MA1 or MB1. Thereafter, the insulating film iF2 is deposited over the insulating film iR by a CVD process or the like so as to cover the heater metal wire HM and the wirings MA1 and MB1, and then the contact hole CT2 is formed in the insulating film iF 2 similarly to the contact hole CT1.

Next, the wirings MA2 and MB2 are formed over the insulating film iF2 similarly to the wiring MA1 and the like, and then the protective film PF is deposited by a CVD process or the like so as to cover the wirings MA2 and MB2, and further the opening Hp is formed in the protective film PF by a lithography process and a dry etching process. Thereafter, electrical characteristic tests are performed on the individual chips over the substrate SB, and then the individual chips are cut from the substrate SB through a dicing process, whereby a semiconductor device having an optical device is manufactured.

Second Embodiment

Figure 5:
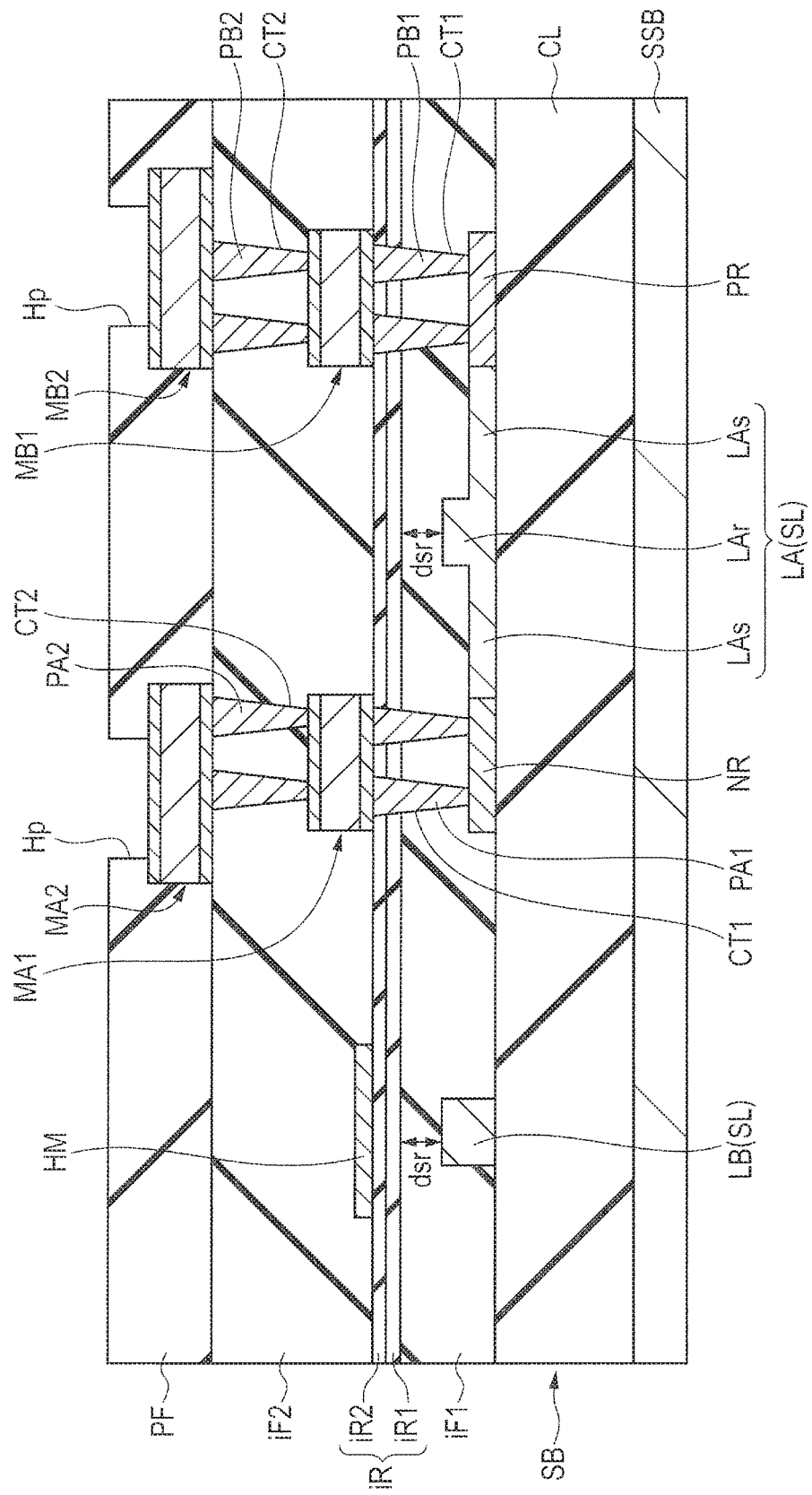
FIG. 5 is a sectional view of a main part of a semiconductor device according to Second Embodiment.

FIG. 5 is a sectional view of a main part of the semiconductor device according to Second Embodiment.

In Second Embodiment, the insulating film iR has an insulating film (third insulating film) iR1 and an insulating film (fourth insulating film) iR2 laminated thereover. The lower insulating film iR1 includes, for example, silicon oxynitride, and the upper insulating film iR2 includes, for example, silicon nitride. That is, when it is assumed that the refractive index of the lower insulating film iR1 is n3 and that of the upper insulating film iR2 is n4, the relationship of n4>n3 is satisfied. The wirings MA1 and MB1 and the heater metal wire HM are formed over the insulating film iR in a state of being in contact with the insulating film iR2.

According to Second Embodiment, the scattered light, the reflected light, or the like, which is caused when the leaked light from the optical waveguide LA or LB hits the wiring MA1 or the heater metal wire HM, can be reflected toward the wiring MA1 and MB1 and the heater metal wire HM in two stages including at the interface between the insulating film iR2 and the insulating film iR1 and at the interface between the insulating film iR1 and the insulating film iF1. Therefore, the influence of the return light (reflected light), from the wirings MA1 and MB1, the heater metal wire HM or the like to the optical waveguide LA or LB, can be suppressed or prevented more effectively. Also, the thickness of the insulating film iR2 formed of silicon nitride having a high dielectric constant can be made smaller than that of First Embodiment, and hence capacitance load can be reduced. Herein, the insulating films iR1 and iR2 may be turned upside down. That is, the silicon oxide film can be laminated over the silicon nitride film. Other configurations and advantages are the same as those of First Embodiment.

Third Embodiment

Figure 6:
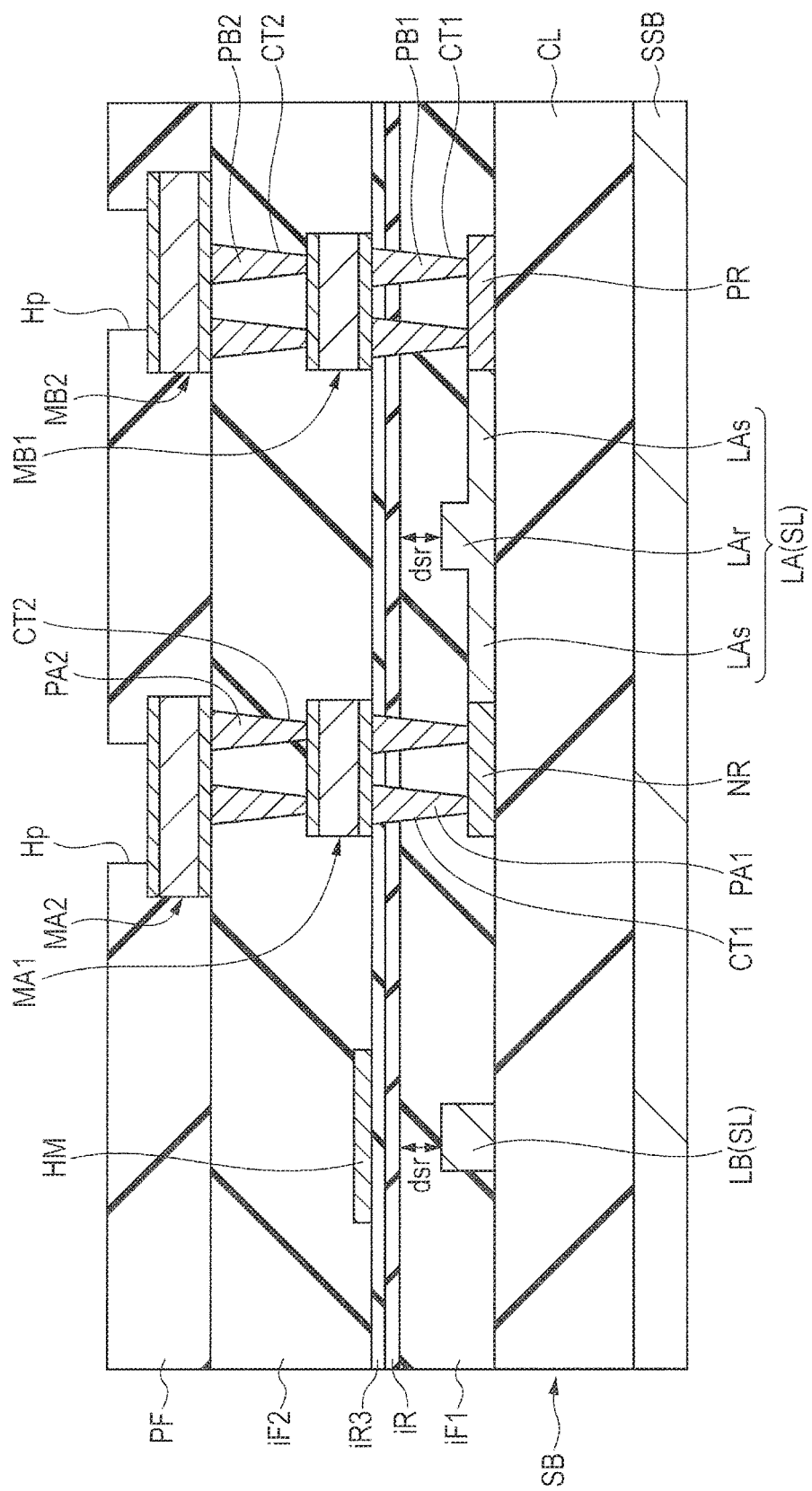
FIG. 6 is a sectional view of a main part of a semiconductor device according to Third Embodiment.

FIG. 6 is a sectional view of a main part of a semiconductor device according to Third Embodiment.

In Third Embodiment, an insulating film iF3 including, for example, silicon oxide is laminated over an insulating film iR including, for example, silicon nitride or silicon oxynitride, and the wirings MA1 and MB1, the heater metal wire HM, and the like are formed over the insulating film iF3. That is, the wirings MA1 and MB1 and the heater metal wire HM are formed over the insulating film iF3 including silicon oxide in a state of being in contact with the insulating film iF3 (in this example, the insulating film iR is the third insulating film and the insulating film iF3 is the fourth insulating film). However, the insulating film iR of Third Embodiment may be composed of a laminated film of the insulating films iR1 and iR2 (see FIG. 5) similarly to the insulating film iR of Second Embodiment.

In Third Embodiment, a silicon oxide film, which is generally used as a base insulating film of a conductive film, is used as a material of the insulating film iF3 underlying the wirings MA1 and MB1, the heater metal wire HM, and the like, as described above. Therefore, few changes are generated in forming the wiring structures and the wirings, and a wiring forming technique, completed in a semiconductor device manufacturing technique, can be applied as it is. Accordingly, the reliability of a semiconductor device can be improved. Other configurations and advantages are the same as those of First and Second Embodiments.

Fourth Embodiment

Figure 7:
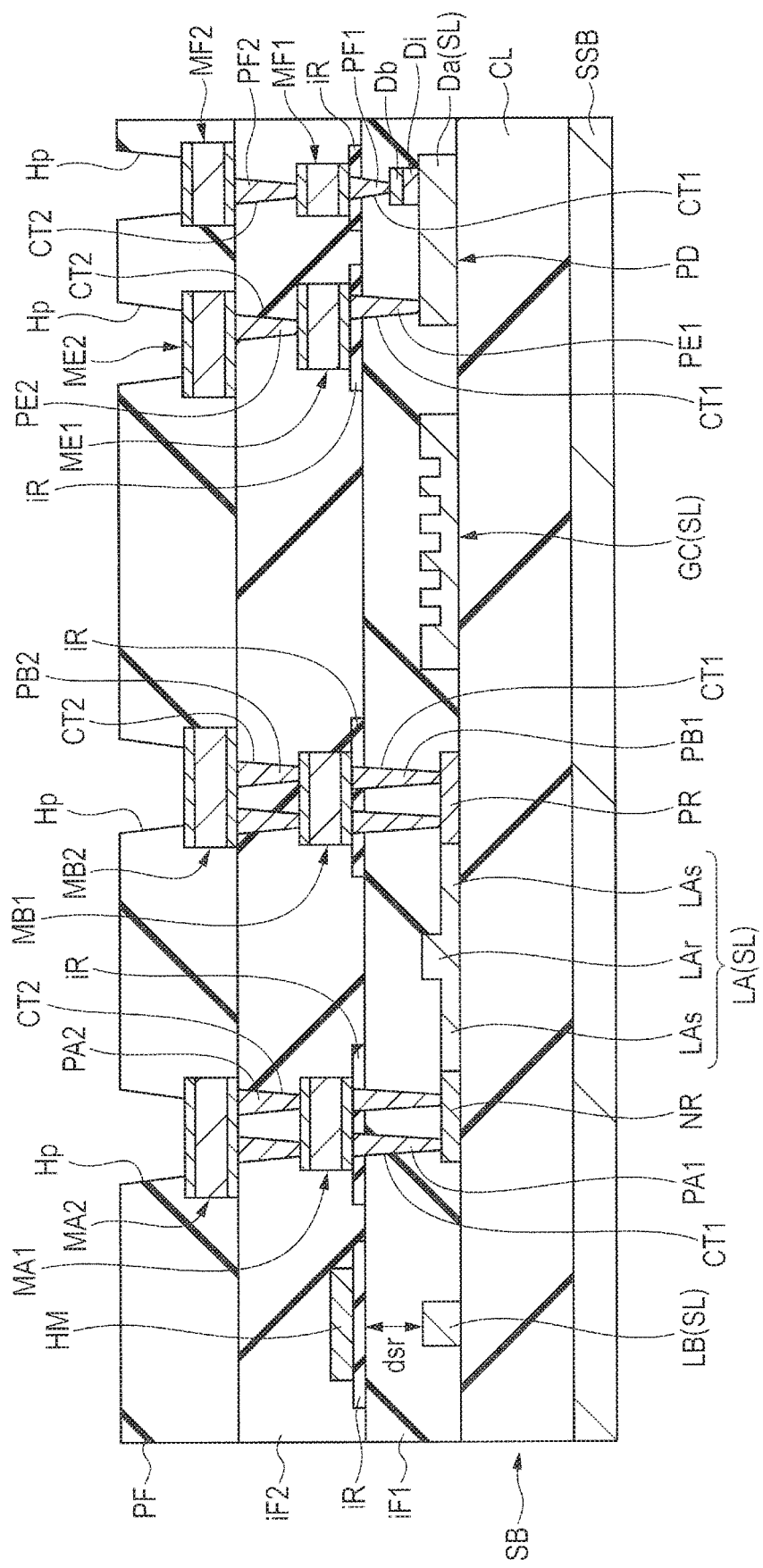
FIG. 7 is a sectional view of a main part of a semiconductor device according to Fourth Embodiment.
Figure 8:
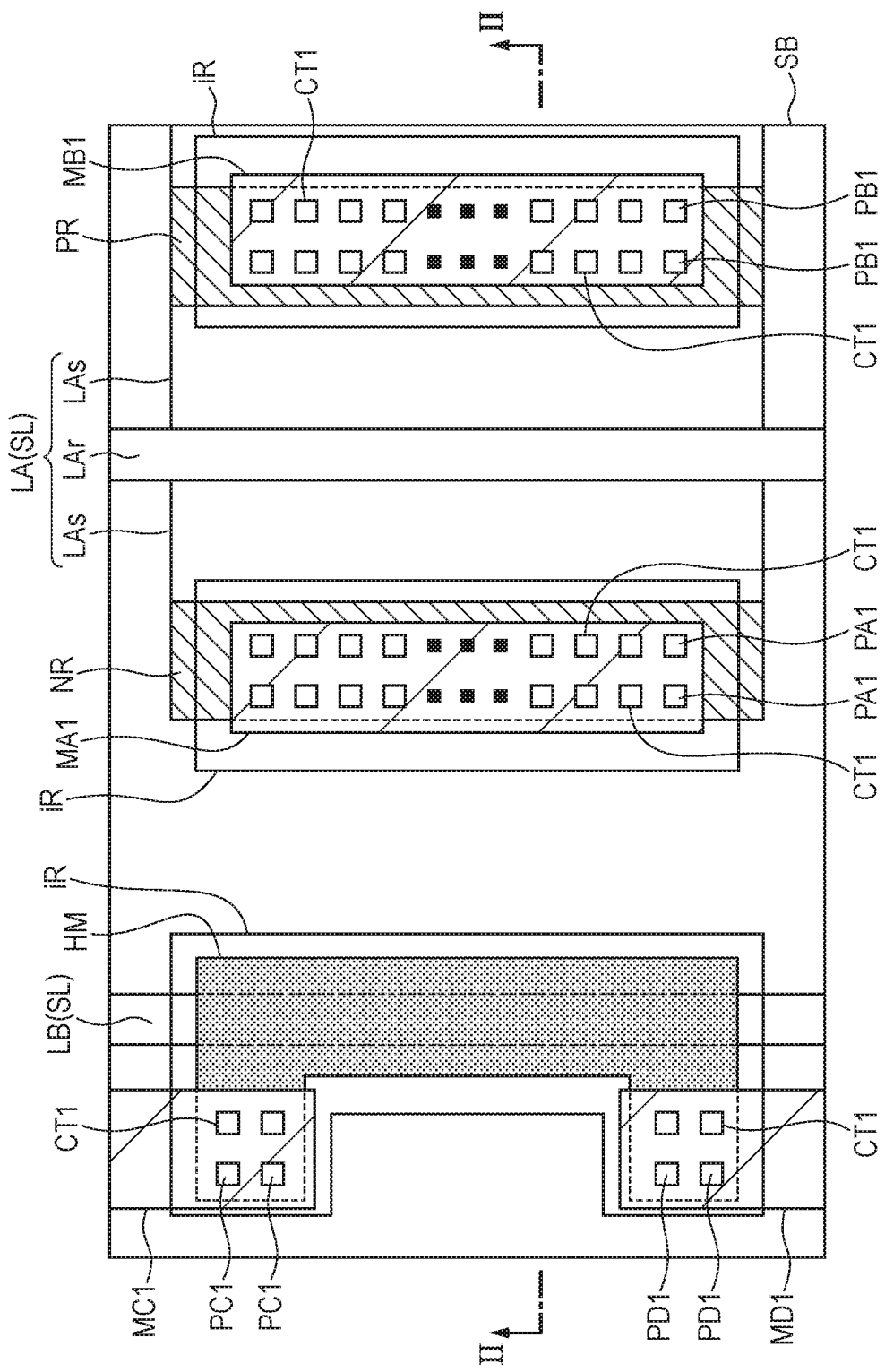
FIG. 8 is a plan view of the main part of the semiconductor device of FIG. 7.

FIG. 7 is a sectional view of a main part of a semiconductor device according to Fourth Embodiment, and FIG. 8 is a plan view of the main part of the semiconductor device of FIG. 7. The sectional view of FIG. 7, at the formation positions of optical waveguides composing an electrically controlled optical modulator or optical waveguides composing an temperature-controlled optical modulator, is taken along Line II-II of FIG. 8. In FIG. 8, hatching is given to the wirings, the heater metal wire, and the semiconductor region in order to make the view easy to be seen.

In Fourth Embodiment, the insulating film iR is partially (selectively) formed. Herein, the insulating films iR are formed at the positions corresponding to the wirings MA1 and MB1, the wirings (conductive films) ME1 and MF1, and the heater metal wire HM. That is, the insulating films iR are partially arranged under the wirings MA1, MB1, ME1, and MF1 and the heater metal wire HM such that the reflected light from the wiring MA1, MB1, ME1, or MF1 or the heater metal wire HM never travels to the lower optical waveguides LA, LB, and the like. In consideration of a positional deviation due to an error in manufacturing the heater metal wire HM, the plane area of each of the insulating films iR is slightly larger than that of each of the wirings MA1 and MB1 and the heater metal wire HM in plan view, as illustrated in FIG. 8. In plan view, each of the wirings MA1 and MB1 and the heater metal wire HM is arranged to be enclosed by the insulating film iR corresponding thereto. In order to partially form the insulating film iR, part of the insulating film iR that has been deposited over the insulating film iF1 may be removed by a lithography technique and an etching technique, as described in First Embodiment.

The insulating film iR of Fourth Embodiment may be composed of a single film of, for example, a silicon nitride film or a silicon oxynitride film, similarly to First Embodiment, or may be composed of a laminated film of, for example, a silicon nitride film and a silicon oxynitride film, similarly to Second Embodiment. Also, in Fourth Embodiment, the insulating film iF3 (see FIG. 6) including silicon oxide or the like may be provided between the wirings MA1 and MB1 or the heater metal wire HM and the insulating film iR, similarly to Third Embodiment. In the case of Fourth Embodiment, the area of the insulating film iR having a higher dielectric constant than silicon oxide can be made smaller than those of First to Third Embodiments, and hence capacitance load can be further reduced.

Also, in Fourth Embodiment, other optical devices, such as a grating coupler GC and a photodetector PD, are formed over the insulating layer CL of the substrate SB, as illustrated on the right side of FIG. 7. Hereinafter, these optical devices will be described.

<Grating Coupler>

The grating coupler GC is an I/O element (input/output element) that couples optical paths inside and outside the substrate SB, and is provided with a relay function of propagating light traveling through the optical waveguide over the substrate SB to an optical fiber or the like outside the substrate SB or of propagating, on the contrary, light from an optical fiber or the like outside the substrate SB into the optical waveguide over the substrate SB.

The main body of the grating coupler GC is formed of the above semiconductor layer SL. A diffraction grating is formed over the upper surface (light input/output portion) of the semiconductor layer SL composing the grating coupler GC. The diffraction grating has a plurality of protrusions (a plurality of irregularities) periodically formed along the propagation direction of light and in parallel to each other. Each protrusion is linearly formed in plan view.

Over the grating coupler GC, the insulating films iF1 and iF2 and the protective film PF are sequentially deposited from bottom to top. However, the insulating film iR is not partially arranged over the optical path above the light input/output portion of the grating coupler GC. This is because if the insulating film iR is arranged over the optical path above the grating coupler GC, propagation of light is hindered by the insulating film iR. That is, the light emitted from the outside toward the grating coupler GC is blocked by the insulating film iR, and on the contrary, the light emitted from the grating coupler GC toward the outside is blocked by the insulating film iR, whereby optical signals cannot be transmitted satisfactorily. When a material that hinders propagation of light is used as a material of the protective film PF, it is preferable that the protective film PF is not partially arranged over the optical path above the light input/output portion of the grating coupler GC for the same reason. With the configuration as described above, the transmission and reception of optical signals at the grating coupler GC can be performed satisfactorily.

<Photodetector>

The photodetector PD is a photoelectric converter that converts an optical signal into an electrical signal.

Herein, the photodetector PD having a vertical p-i-n junction diode structure is illustrated. That is, the photodetector PD has a p-type semiconductor layer (first semiconductor layer) Da formed over the insulating layer CL, an i-type semiconductor layer Di formed thereover, and further an n-type semiconductor layer (second semiconductor layer) Db formed over the semiconductor layer Di.

The p-type semiconductor layer Da is formed by introducing impurities, such as boron (B), into the above semiconductor layer SL. The i-type semiconductor layer Di includes, for example, germanium (Ge) and is formed of an intrinsic semiconductor. The n-type semiconductor layer Db is formed by, for example, introducing predetermined impurities into the Ge layer. Alternatively, the lower semiconductor layer Da may be n-type and the upper semiconductor layer Db may be p-type. The photodetector PD can be manufactured, for example, by a method similar to the manufacturing method of a photodetector publicly known as a silicon photonics photodetector.

The p-type semiconductor layer Da is electrically coupled to wiring ME1 through a plug PE1, and the n-type semiconductor layer Db is electrically coupled to wiring MF1 through a plug PF1. Each of the plugs PE1 and PF1 is formed by embedding a conductive film, such as W, in the contact hole CT1 drilled in the insulating films iR and iF1. The configurations of the wirings ME1 and MF1 are, for example, the same as those of the wirings MA1 and MB1.

The wiring ME1 is electrically coupled to wiring ME2 through a plug PE2, and the wiring MF1 is electrically coupled to wiring MF2 through a plug PF2. Each of the plugs PE2 and PF2 is formed by embedding a conductor film, such as, for example, W, in the contact hole CT2 drilled in the insulating film iF2. The configurations of the wirings ME2 and MF2 are, for example, the same as those of the wirings MA2 and MB2. Herein, openings Hp, each for exposing part of the wiring ME2 or MF2, are formed in parts of the protective film PF. The exposed portions of the wirings ME2 and MF2 serve as coupling pad portions for the photodetector PD.

The insulating films iF1 and iF2 and the protective film PF are sequentially deposited over the photodetector PD from bottom to top. However, the insulating film iR is not partially arranged over the optical path for light incident on the light receiving portion of the photodetector PD from above. This is because if the insulating film iR is arranged over the optical path above the photodetector PD, propagation of light is hindered by the insulating film iR. That is, the light emitted from the outside toward the photodetector PD is blocked by the insulating film iR, whereby optical signals cannot be transmitted satisfactorily. When a material that hinders propagation of light is used as a material of the protective film PF, it is preferable that the protective film PF is not partially arranged over the optical path above the light receiving portion of the photodetector PD for the same reason. With the configuration as described above, the reception of optical signals at the photodetector PD can be performed satisfactorily.

<Configuration Example of Opto-Electric Hybrid Device>

Figure 9:
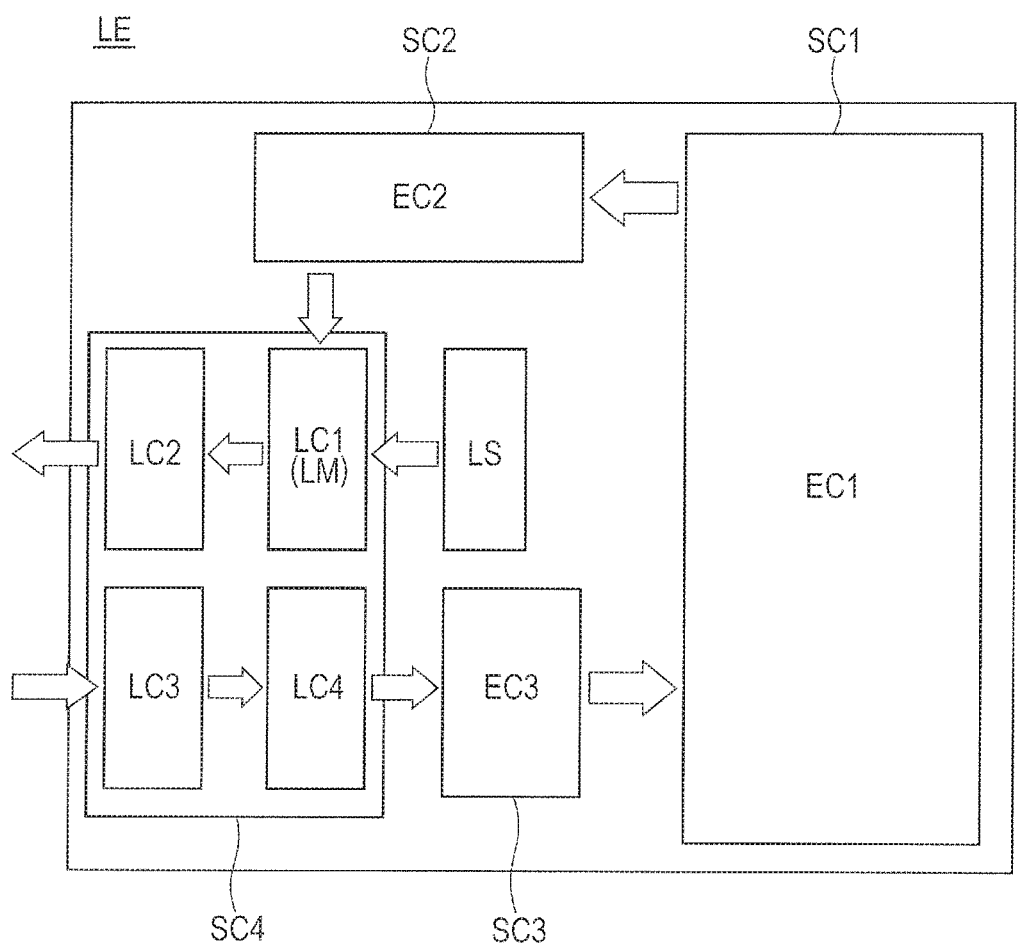
FIG. 9 is a schematic configuration view of one example of an opto-electric hybrid device using the semiconductor device of FIG. 7.

Next, one example of an opto-electric hybrid device using the semiconductor device of Fourth Embodiment will be described with reference to FIG. 9. FIG. 9 is a schematic configuration view of one example of an opto-electric hybrid device using the semiconductor device of FIG. 7.

For example, four semiconductor chips (hereinafter simply referred to as chips) SC1 to SC4 and a light source LS are mounted on an opto-electric hybrid device LE.

Electronic circuits EC1, EC2, and EC3 are formed in the chips SC1, SC2, and SC3, respectively, and optical circuits LC1 to LC4 are formed in the chip SC4. The light source LS is a laser oscillator that emits a laser beam of a predetermined wavelength, and is optically coupled to the optical circuit LC1 in the chip SC4 through an optical fiber or the like. That is, continuous wave laser light of a predetermined wavelength emitted from the light source LS is allowed to be incident on the input of the optical circuit LC1.

The electronic circuit EC1 in the chip SC1 includes a control circuit and a memory circuit, and is electrically coupled to the electronic circuit EC2 in the chip SC2. The electronic circuit EC2 is composed of a circuit capable of exchanging bidirectional signals, such as, for example, a transceiver IC (Transceiver Integrated Circuit), and is electrically coupled to the optical circuit LC1 in the chip SC4.

The optical circuit LC1 is an optical circuit that converts an electrical signal into an optical signal, and is composed of, for example, the above optical modulator LM (see FIG. 4). In the optical circuit LC1, the phase of the light incident from the light source LS is modulated based on a control signal (electrical signal) sent from the electronic circuit EC1 via the electronic circuit EC2. In this case, the light source LS is optically coupled to the input optical waveguide Li (see FIG. 4) of the optical circuit LC1 (optical modulator LM). Thereby, the continuous wave laser light emitted from the light source LS is allowed to be incident on the input optical waveguide Li (see FIG. 4) of the optical circuit LC1 (optical modulator LM). Also, the electronic circuit EC2 is electrically coupled to the respective optical waveguides LA and LA (see FIGS. 4 and 7) of the optical circuit LC1 (optical modulator LM). Thereby, the potential supplied from the electronic circuit EC1 to the optical circuit LC1 via the electronic circuit EC2 is supplied to the respective optical waveguides LA and LA (see FIGS. 4 and 7) of the optical circuit LC1.

The output of the optical circuit LC1 (the output optical waveguide Lo (see FIG. 4) of the optical modulator LM) is optically coupled to the optical circuit LC2 in the same chip SC4. The optical circuit LC2 is an optical coupler such as, for example, a grating coupler (the grating coupler GC in FIG. 7) or a spot size converter. The optical signal sent from the optical circuit LC1 is output to the outside of the opto-electric hybrid device LE via the optical circuit LC2.

The optical circuit LC3 in the chip SC4 is an I/O element such as, for example, a grating coupler (the grating coupler GC in FIG. 7) or a spot size converter, and is optically coupled to the optical circuit LC4. An optical signal input from the outside of the opto-electric hybrid device LE is input to the optical circuit LC4 via the optical circuit LC3. The optical circuit LC4 is a photodetector (the photodetector PD in FIG. 7) for photoelectric conversion in which the optical signal sent from the optical circuit LC3 is converted into an electrical signal, and is electrically coupled to the electronic circuit EC3 in the chip SC3. This electronic circuit EC3 is composed of a circuit capable of exchanging bidirectional signals, such as, for example, a transceiver IC, and is electrically coupled to the electronic circuit EC1 in the chip SC1.

According to Fourth Embodiment, the reliability of the optical modulator LM can be improved as described above, and hence the reliability of the opto-electric hybrid device LE can be improved. In the above description, the electronic circuits and the optical circuits are formed on separate chips, respectively, but the invention should not be limited thereto and electronic circuits and optical circuits can be formed on one chip. Thereby, the opto-electric hybrid device LE can be further miniaturized. Also, the opto-electric hybrid device LE can be highly integrated, and hence the function of an opto-electric hybrid circuit LS can be improved. Other configurations and advantages are the same as those of First to Third Embodiments.

The invention made by the present inventors has been specifically described above based on its preferred embodiments, but it is needless to say that the invention should not be limited to the embodiments and may be modified variously within a range not departing from the gist thereof.

The case where, for example, the insulating film iR is formed under the first-layer wiring has been described in First to Fourth Embodiments, but the invention should not be limited thereto, and the insulating films iR may be formed under both of the first-layer wiring (conductive film) and the upper wiring (conductive film) (i.e., in different layers).

[Supplementary Note 1]

A manufacturing method of a semiconductor device including the steps of:

(a) forming an optical waveguide having a refractive index n1 over a first insulating film;

(b) forming a second insulating film having a refractive index n2 over the first insulating film so as to cover the optical waveguide;

(c) forming a third insulating film having a refractive index n3 over the second insulating film; and (d) forming a conductive film over the third insulating film, in which the shortest distance between the optical waveguide and the third insulating film is smaller than a thickness of the first insulating film, and in which the refractive indices n1, n2, and n3 satisfy the relationships of n1>n2 and n3>n2.

[Supplementary Note 2]

The manufacturing method of a semiconductor device according to Supplementary Note 1, in which a thickness of the second insulating film is larger than a thickness of the third insulating film.

[Supplementary Note 3]

The manufacturing method of a semiconductor device according to Supplementary Note 1, in which the third insulating film is a silicon nitride film or a silicon oxynitride film.

[Supplementary Note 4]

The manufacturing method of a semiconductor device according to Supplementary Note 1, in which the step (a) includes a step of forming a photodetector over a substrate, and in which the step (c) includes a step of partially removing the third insulating film located over an optical path for light incident on the photodetector.

[Supplementary Note 5]

The manufacturing method of a semiconductor device according to Supplementary Note 1, in which the step (a) includes a step of forming a grating coupler over the substrate, and in which the step (c) includes a step of partially removing the third insulating film located over an optical path for light emitted from the grating coupler or incident on the grating coupler.

[Supplementary Note 6]

A manufacturing method of a semiconductor device including the steps of:

(a) forming an optical waveguide having a refractive index n1 over a first insulating film;

(b) forming a second insulating film having a refractive index n2 over the first insulating film so as to cover the optical waveguide;

(c) forming a third insulating film having a refractive index n3 over the second insulating film;

(d) forming a fourth insulating film over the third insulating film; and (e) forming a conductive film over the fourth insulating film, in which the refractive indices n1, n2, and n3 satisfy the relationships of n1>n2 and n3>n2.

[Supplementary Note 7]

The manufacturing method of a semiconductor device according to Supplementary Note 6, in which the shortest distance between the optical waveguide and the third insulating film is smaller than a thickness of the first insulating film.

[Supplementary Note 8]

The manufacturing method of a semiconductor device according to Supplementary Note 6, in which a thickness of the second insulating film is larger than a thickness of the third insulating film.

[Supplementary Note 9]

The manufacturing method of a semiconductor device according to Supplementary Note 6, in which the fourth insulating film has a refractive index n4, and in which the refractive indices n3 and n4 satisfy the relationship of n4>n3.

[Supplementary Note 10]

The manufacturing method of a semiconductor device according to Supplementary Note 6, in which the third insulating film is a silicon oxynitride film, and in which the fourth insulating film is a silicon nitride film.

[Supplementary Note 11]

The manufacturing method of a semiconductor device according to Supplementary Note 6, in which the fourth insulating film is a silicon oxide film.

[Supplementary Note 12]

The manufacturing method of a semiconductor device according to Supplementary Note 6, in which the step (a) includes a step of forming a photodetector over the first insulating film, and in which the step (c) includes a step of partially removing the third insulating film located over an optical path for light incident on the photodetector.

[Supplementary Note 13]

The manufacturing method of a semiconductor device according to Supplementary Note 6, in which the step (a) includes a step of forming a grating coupler over the first insulating film, and in which the step (c) includes a step of partially removing the third insulating film located over an optical path for light emitted from the grating coupler or incident on the grating coupler.

[Supplementary Note 14]

A manufacturing method of a semiconductor device including the steps of:

(a) forming an optical waveguide having a refractive index n1 over a first insulating film;

(b) forming a second insulating film having a refractive index n2 over the first insulating film so as to cover the optical waveguide;

(c) forming a third insulating film having a refractive index n3 over the second insulating film; and (d) forming a conductive film over the third insulating film, in which in the step (c), the third insulating film is formed at a position corresponding to the conductive film, and in which the refractive indices n1, n2, and n3 satisfy the relationships of n1>n2 and n3>n2.

[Supplementary Note 15]

The manufacturing method of a semiconductor device according to Supplementary Note 14, in which the shortest distance between the optical waveguide and the third insulating film is smaller than a thickness of the first insulating film.

[Supplementary Note 16]

The manufacturing method of a semiconductor device according to Supplementary Note 14, in which a thickness of the second insulating film is larger than a thickness of the third insulating film.

[Supplementary Note 17]

The manufacturing method of a semiconductor device according to Supplementary Note 14, including the step of:

after the step (c) and before the step (d), forming a fourth insulating film having a refractive index n4 between the third insulating film and the conductive film.

[Supplementary Note 18]

The manufacturing method of a semiconductor device according to Supplementary Note 14, in which the third insulating film is a silicon nitride film or a silicon oxynitride film.

[Supplementary Note 19]

The manufacturing method of a semiconductor device according to Supplementary Note 14, in which the step (a) includes a step of forming a photodetector over the first insulating film, and in which the step (c) includes a step of partially removing the third insulating film located over an optical path for light incident on the photodetector.

[Supplementary Note 20]

The manufacturing method of a semiconductor device according to Supplementary Note 14, in which the step (a) includes a step of forming a grating coupler over the first insulating film, and in which the step (c) includes a step of partially removing the third insulating film located over an optical path for light emitted from the grating coupler or incident on the grating coupler.

What is claimed is:

1. A semiconductor device comprising:

a first insulating film formed over a substrate;

an optical waveguide formed over the first insulating film and having a refractive index n1;

a second insulating film formed over the first insulating film so as to cover the optical waveguide and having a refractive index n2;

a third insulating film formed over the second insulating film and having a refractive index n3, the third insulating film including a portion that overlaps the optical waveguide in plan view; and a conductive film formed over the third insulating film, the conductive film being formed over the portion of the third insulating film such that the conductive film overlaps the optical waveguide in plan view, wherein the shortest distance between the optical waveguide and the third insulating film is smaller than a thickness of the first insulating film, and wherein the refractive indices n1, n2, and n3 satisfy the relationships of n1 >n2 and n3 >n2.

2. The semiconductor device according to claim 1, wherein a thickness of the second insulating film is larger than a thickness of at least the portion of the third insulating film.

3. The semiconductor device according to claim 1, wherein the third insulating film is a silicon nitride film or a silicon oxynitride film.

4. The semiconductor device according to claim 1, further comprising:

a photodetector having a first semiconductor layer of a first conductivity type and a second semiconductor layer of a second conductivity type different from the first conductivity type over the first insulating film, wherein the third insulating film is not arranged over an optical path for light incident on the photodetector.

5. The semiconductor device according to claim 1, wherein the optical waveguide further includes a grating coupler having a plurality of protrusions formed to be parallel to each other, and wherein the third insulating film is not arranged over an optical path for light emitted from the grating coupler or incident on the grating coupler.

6. A semiconductor device comprising:

a first insulating film formed over a substrate;

an optical waveguide formed over the first insulating film and having a refractive index n1;

a second insulating film formed over the first insulating film so as to cover the optical waveguide and having a refractive index n2;

a third insulating film formed over the second insulating film and having a refractive index n3, the third insulating film including a portion that is formed directly above the optical waveguide; and a conductive film formed over the third insulating film, wherein the third insulating film is arranged at a position corresponding to the conductive film, wherein the refractive indices n1, n2, and n3 satisfy the relationships of n1 >n2 and n3 >n2, and wherein the shortest distance between the optical waveguide and the third insulating film is smaller than a thickness of the first insulating film.

7. The semiconductor device according to claim 6, wherein a thickness of the second insulating film is larger than a thickness of at least the portion of the third insulating film.

8. The semiconductor device according to claim 6, further comprising:

a fourth insulating film formed between the third insulating film and the conductive film.

9. The semiconductor device according to claim 6, wherein the third insulating film is a silicon nitride film or a silicon oxynitride film.

10. The semiconductor device according to claim 8, wherein the fourth insulating film has a refractive index n4, and wherein the refractive indices n3 and n4 satisfy the relationship of n4 >n3.

11. The semiconductor device according to claim 8, wherein the fourth insulating film is a silicon nitride film.

12. The semiconductor device according to claim 8, wherein the fourth insulating film is a silicon oxide film.

13. The semiconductor device according to claim 6, further comprising:
   a photodetector having a first semiconductor layer of a first conductivity type and a second semiconductor layer of a second conductivity type different from the first conductivity type over the first insulating film,
   wherein the third insulating film is not arranged over an optical path above the photodetector.

14. The semiconductor device according to claim 6, wherein the optical waveguide further includes a grating coupler having a plurality of protrusions formed to be parallel to each other, and
   wherein the third insulating film is not arranged over an optical path for light emitted from the grating coupler or incident on the grating coupler.

* * * * *